(12) United States Patent
Chen et al.

(10) Patent No.: US 8,373,229 B2
(45) Date of Patent: Feb. 12, 2013

(54) GATE CONTROLLED BIPOLAR JUNCTION TRANSISTOR ON FIN-LIKE FIELD EFFECT TRANSISTOR (FINFET) STRUCTURE

(75) Inventors: Chia-Chung Chen, Keelung (TW); Chewn-Pu Jou, Hsinchu (TW); Feng Yuan, Yonghe (TW); Sally Liu, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 190 days.

(21) Appl. No.: 12/871,476

(22) Filed: Aug. 30, 2010

(65) Prior Publication Data
US 2012/0049282 A1 Mar. 1, 2012

(51) Int. Cl.
*H01L 27/02* (2006.01)
(52) U.S. Cl. .................. 257/347; 257/E27.112
(58) Field of Classification Search .................. None
See application file for complete search history.

(56) References Cited

U.S. PATENT DOCUMENTS

| | | | |
|---|---|---|---|
| 5,717,241 A | 2/1998 | Milhi et al. | |
| 6,181,623 B1 * | 1/2001 | Shim et al. | 365/208 |
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2004/0048424 A1 * | 3/2004 | Wu et al. | 438/154 |
| 2004/0150029 A1 | 8/2004 | Lee | |
| 2005/0153490 A1 | 7/2005 | Yoon et al. | |
| 2007/0012945 A1 * | 1/2007 | Sugizaki | 257/124 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0182478 A1 | 8/2007 | Mun et al. | |
| 2007/0228372 A1 | 10/2007 | Yang et al. | |
| 2008/0258228 A1 | 10/2008 | Chuang et al. | |
| 2008/0263492 A1 | 10/2008 | Chuang et al. | |
| 2008/0290470 A1 | 11/2008 | King et al. | |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Fei Fei Yeung Lopez
(74) *Attorney, Agent, or Firm* — Haynes and Boone, LLP

(57) ABSTRACT

An integrated circuit device is disclosed. An exemplary integrated circuit device includes: a semiconductor substrate; a fin structure disposed over the semiconductor substrate; and a gate structure disposed over the base portion of the fin structure. The collector portion is a first doped region including a first type dopant, and is coupled with a first terminal for electrically biasing the collector portion. The emitter portion is a second doped region including the first type dopant, and is coupled with a second terminal for electrically biasing the emitter portion. The base portion is a third doped region including a second type dopant opposite the first type, and is coupled with a third terminal for electrically biasing the base portion. The gate structure is coupled with a fourth terminal for electrically biasing the gate structure, such that the gate structure controls a path of current through the base portion.

20 Claims, 11 Drawing Sheets

U.S. PATENT DOCUMENTS

| | | | |
|---|---|---|---|
| 2008/0296632 | A1 | 12/2008 | Moroz et al. |
| 2009/0035909 | A1 | 2/2009 | Chang et al. |
| 2009/0108351 | A1* | 4/2009 | Yang et al. .................... 257/347 |
| 2009/0181477 | A1 | 7/2009 | King et al. |
| 2010/0006945 | A1 | 1/2010 | Merelle et al. |
| 2010/0006974 | A1 | 1/2010 | Xu et al. |
| 2010/0052059 | A1 | 3/2010 | Lee |
| 2010/0183961 | A1 | 7/2010 | Shieh et al. |
| 2010/0203734 | A1 | 8/2010 | Shieh et al. |
| 2010/0246277 | A1* | 9/2010 | Widjaja et al. .......... 365/189.04 |
| 2010/0264468 | A1 | 10/2010 | Xu |
| 2010/0320572 | A1* | 12/2010 | Chung et al. ................. 257/588 |

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

Fu-Liang Yang et al., "35nm CMOS FinFETs", 2002 Symposium on VLSI Technology Digest of Technical Papers, 11.2, pp. 104-105.

Jong-Tae Park et al., "Multiple-Gate SOI MOSFETs: Device Design Guidelines", IEEE Transactions on Electron Devices, vol. 49, No. 12, Dec. 2002, pp. 2222-2229.

Fu-Liang Yang et al., "Strained FIP-SOI (FinFET/FD/PD-SOI) for Sub-65nm CMOS Scaling", 2003 Symposium on VLSI Technology Digest of Technical Papers, 10A-4, pp. 137-138.

* cited by examiner

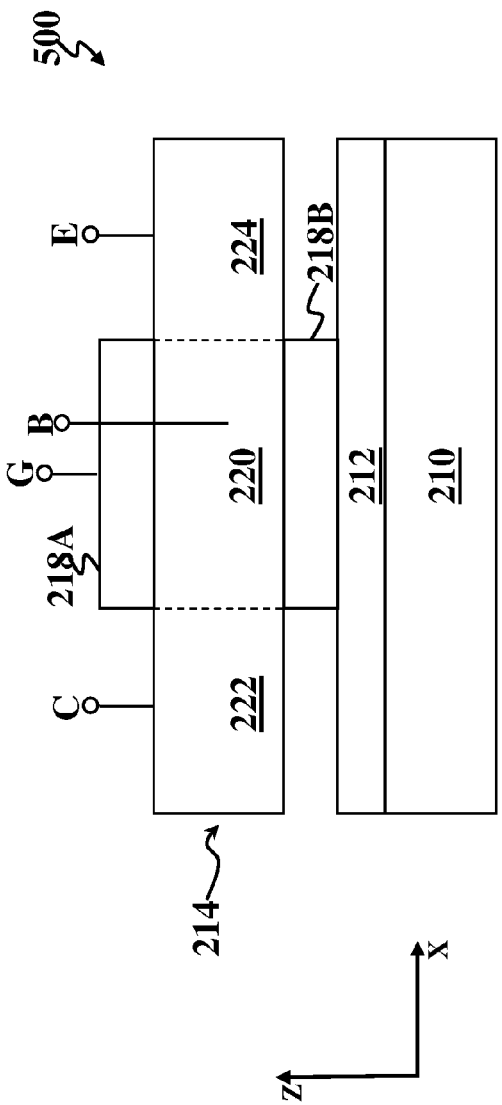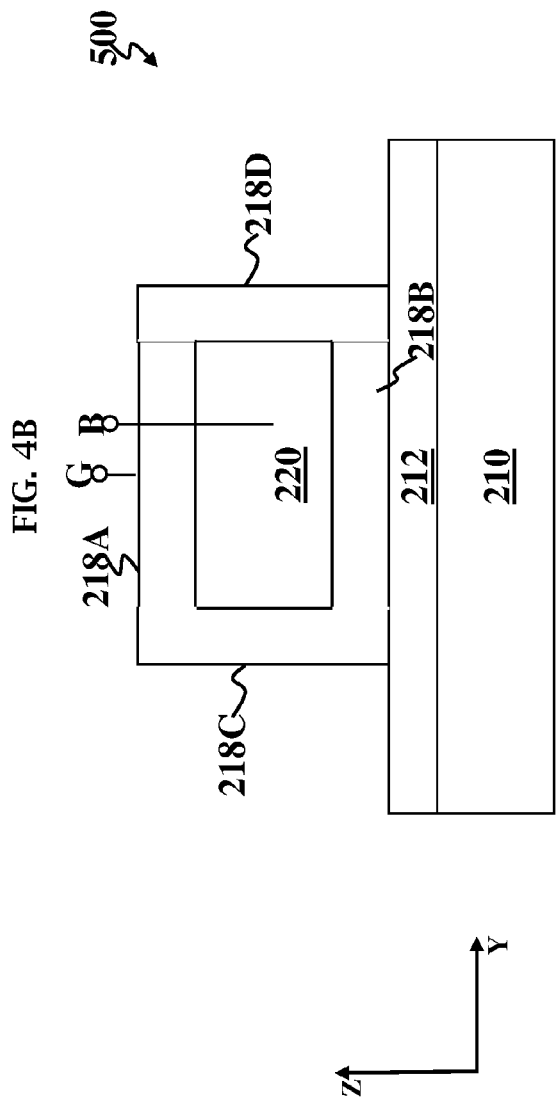

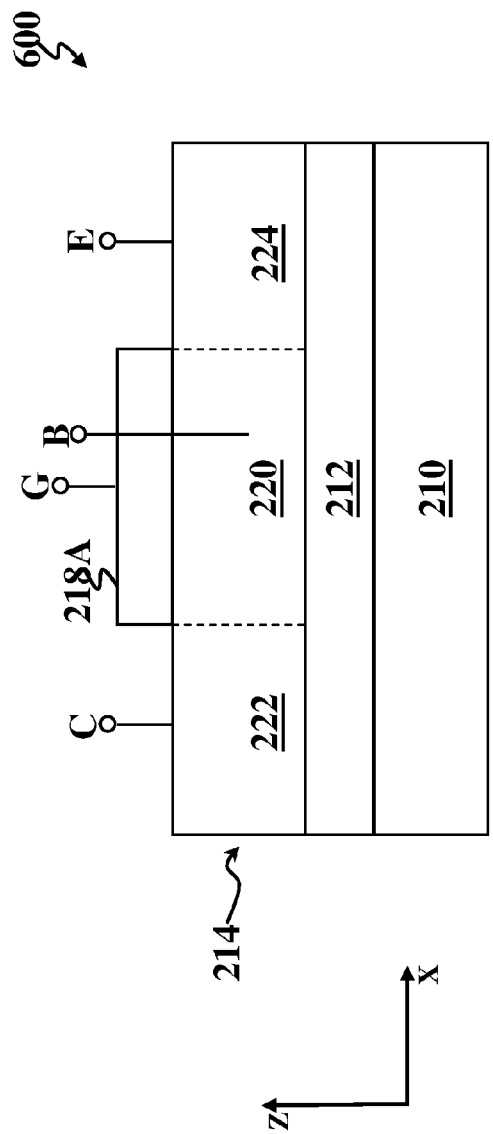
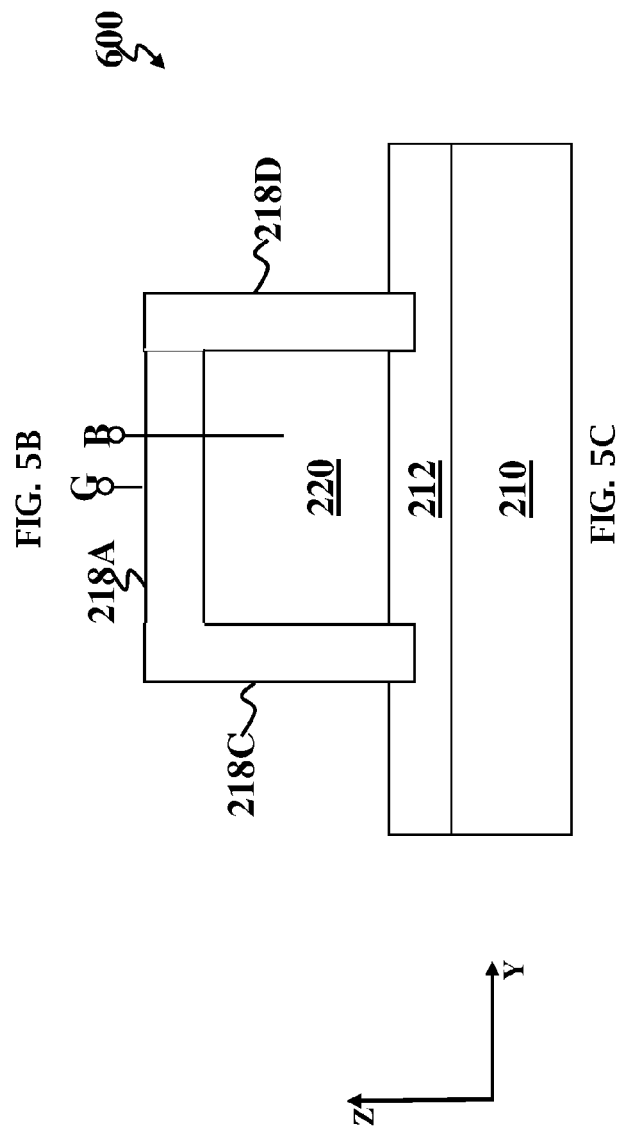
FIG. 5B
FIG. 5C

US 8,373,229 B2

GATE CONTROLLED BIPOLAR JUNCTION TRANSISTOR ON FIN-LIKE FIELD EFFECT TRANSISTOR (FINFET) STRUCTURE

BACKGROUND

A bipolar junction transistor (BJT) is a three-terminal device. The three terminals include a base terminal, a collector terminal, and an emitter terminal. BJTs are formed by two p-n junctions placed back-to-back in close proximity to each other, with one of the regions common to both junctions. There is a first junction between the base and the emitter, and a second junction between the emitter and the collector. This forms either a p-n-p or n-p-n transistor depending upon the characteristics of the semiconductive materials used to form the BJT. The terminals of the BJT are connected to their respective base, collector, and emitter. In BJTs, the current flow through the emitter and collector terminals is controlled by the voltage across the base and emitter terminals. As the semiconductor industry has progressed into nanometer technology process nodes in pursuit of higher device density, higher performance, and lower costs, various techniques have been implemented to improve BJT device performance. For example, as the channel length scaling continues, increased, heavy well doping and threshold voltage doping have been implemented. It has been observed that maintaining high current gains while scaling the channel length is difficult. Although existing BJT devices and methods of fabricating BJT devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4B is a diagrammatic cross-sectional view along a channel of the integrated circuit device taken along line 4B-4B in FIG. 4A.

FIG. 4C is a diagrammatic cross-sectional view of the integrated circuit device taken along line 4C-4C in FIG. 4A.

FIG. 5B is a diagrammatic cross-sectional view along a channel of the integrated circuit device taken along line 5B-5B in FIG. 5A.

FIG. 5C is a diagrammatic cross-sectional view of the integrated circuit device taken along line 5C-5C in FIG. 5A

DETAILED DESCRIPTION

Figure 1A:
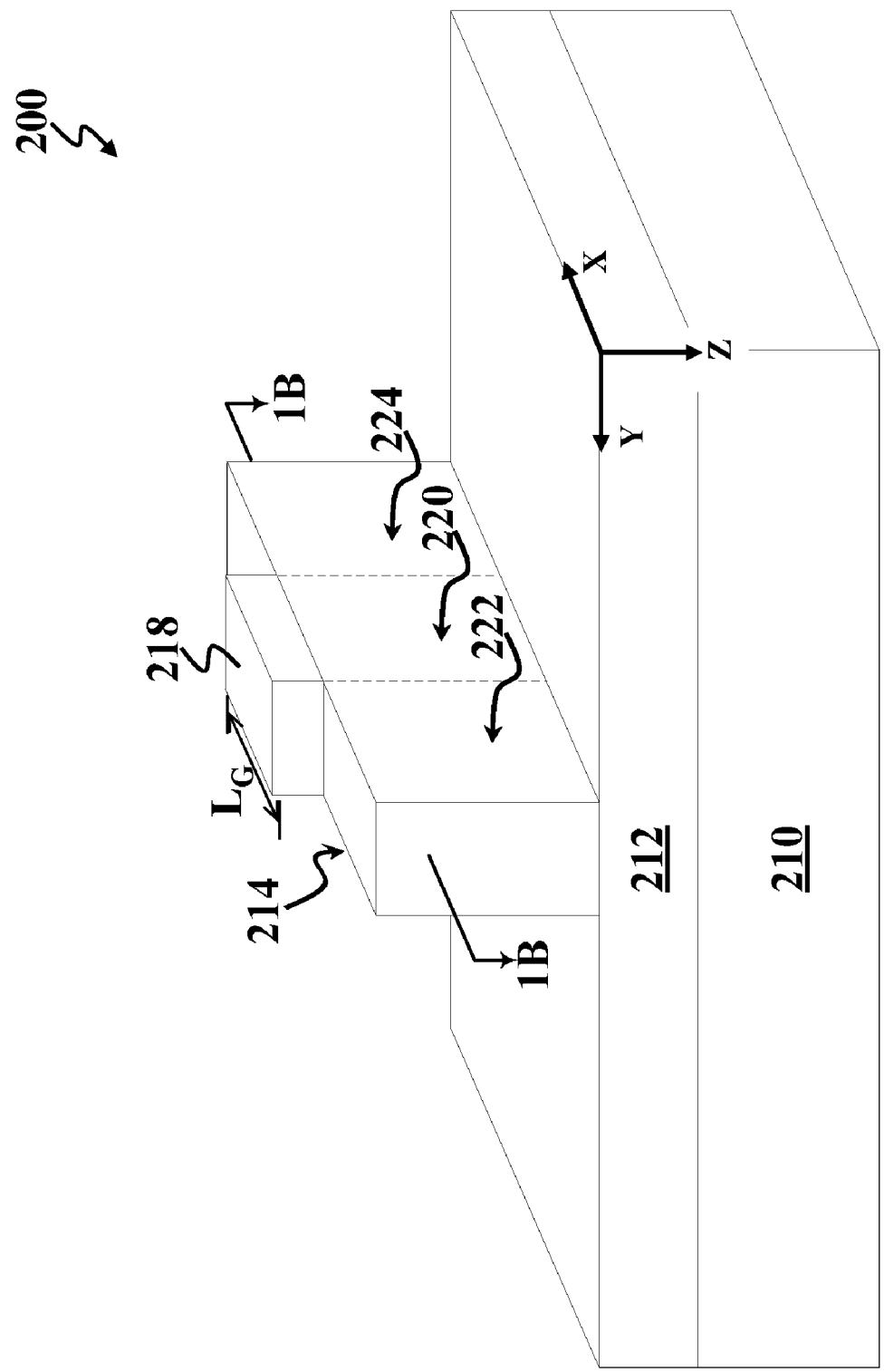
FIG. 1A is a perspective view of an embodiment of an integrated circuit device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
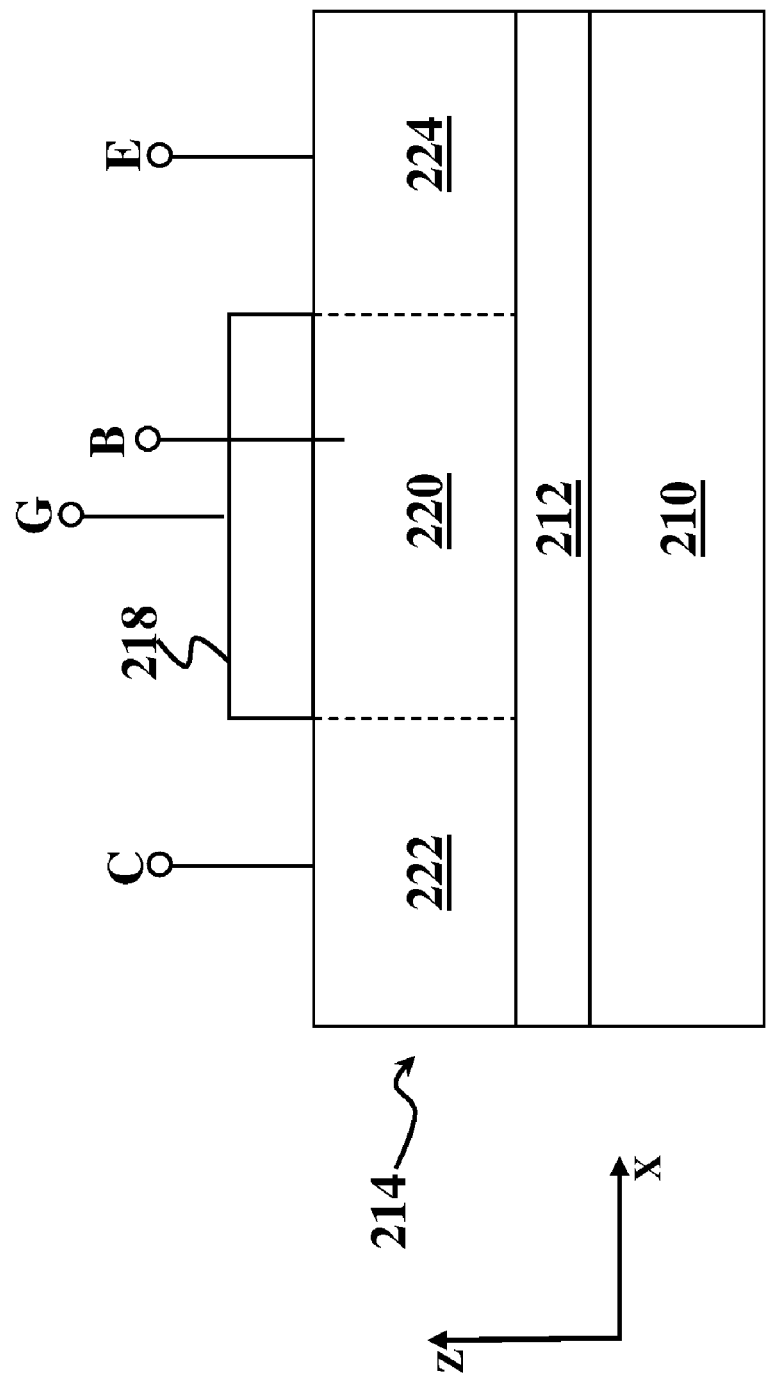
FIG. 1B is a diagrammatic cross-sectional view along a channel of the integrated circuit device taken along line 1B-1B in FIG. 1A.

FIG. 1A is a perspective view of an integrated circuit device 200, in portion or entirety, and FIG. 1B is a diagrammatic cross-sectional view along a channel of the integrated circuit device 200 taken along line 1B-1B in FIG. 1A. FIGS. 1A and 1B will be discussed concurrently and have been simplified for the sake of clarity to better understand the inventive concepts of the present disclosure. As will be discussed in detail below, in the depicted embodiment, the integrated circuit device 200 is a fin-like filed effect transistor (FinFET) device configured to operate as a bipolar junction transistor (BJT) device. The integrated circuit device 200 may thus be referred to as a FinFET device or a BJT device, depending on how the integrated circuit device 200 is configured to operate. In the present disclosure, the term FinFET device refers to any fin-based, single or multi-gate transistor. The integrated circuit device 200 may be included in a microprocessor, memory cell, and/or other integrated circuit device. FIGS. 1A-1B have been simplified for the sake of clarity to better understand the inventive concepts of the present disclosure. Additional features can be added in the integrated circuit device 200, and some of the features described below can be replaced or eliminated in other embodiments of the integrated circuit device 200.

The integrated circuit device 200 includes a substrate (wafer) 210. The substrate 210 is a bulk silicon substrate. Alternatively, the substrate 210 comprises an elementary semiconductor, such as silicon or germanium in a crystalline structure; a compound semiconductor, such as silicon carbide, gallium arsenic, gallium phosphide, indium phosphide, indium arsenide, and/or indium antimonide; or combinations thereof. The substrate 210 may include isolation regions (such as shallow trench isolation (STI) regions), doped regions, and/or other features.

An insulator layer 212 is disposed over the substrate 210. In the depicted embodiment, the insulator layer 212 is an oxide layer, such as a buried oxide (BOX) layer. Alternatively, the insulator layer 212 may include silicon oxide, sapphire, other insulating materials, or combinations thereof. The insulator layer 212 is formed using processes such as implantation (for example, SIMOX), oxidation, deposition, other suitable processes, or combinations thereof. In the depicted embodiment, the substrate 210, insulator layer 212, and an overlying silicon layer patterned to form fins (fin structure 214) are components of a silicon-on-insulator (SOI) substrate. The SOI substrate can be fabricated using separation by implantation of oxygen (SIMOX), wafer bonding, and/or other suitable methods. The SOI substrate is a fully depleted SOI (FDSOI). Alternatively, the SOI substrate is a partially depleted SOI (PDSOI).

A fin structure 214, such as a silicon fin, overlies the insulator layer 212. The fin structure 214 is formed by a suitable process, such as a lithography and etching process. For example, in the depicted embodiment, the fin structure 214 may be formed by forming a photoresist layer (resist) overlying a silicon layer overlying the insulator layer 212 (in other words, an upper silicon layer of a silicon-insulator-silicon stack of the SOI substrate), exposing the resist to a pattern, performing a post-exposure bake process, and developing the resist to form a masking element including the resist. The masking element may then be used to etch the fin structure 214 into the silicon layer. The fin structure 214 may be etched using a reactive ion etch (RIE) and/or other suitable process. Alternatively, the fin structure 214 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets), forming spacers adjacent features and removing the features to provide a pattern of spacers, resist freezing, and/or other suitable processes. Alternatively, the insulator layer 212 may be omitted, and the fin structure 214 is formed in the substrate 210, such that the Si fin extends from the substrate 210.

The integrated circuit device 200 includes a gate structure 218. In the depicted embodiment, the gate structure 218 is disposed on a central portion of the fin structure 214. The gate structure 218 may include a gate dielectric layer and a gate electrode. The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate electrode may be formed in a gate first or gate last process. The gate structure 218 may include numerous other layers, for example, capping layers, interface layers, diffusion layers, barrier layers, or combinations thereof. The gate structure 218 is formed by a process including deposition, lithography patterning, and/or etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable deposition methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable lithography patterning processes, or combinations thereof. Alternatively, the lithography exposing process is implemented or replaced by other methods, such as maskless photolithography, electron-beam writing, and/or ion-beam writing. In yet another alternative, the lithography patterning process could implement nanoimprint technology. The etching processes include dry etching, wet etching, and/or other etching methods.

The gate structure 218 may include spacers disposed on sidewalls of the gate dielectric layer and gate electrode. The spacers comprise a dielectric material, such as silicon oxide, silicon nitride, silicon oxynitride, other suitable material, or combinations thereof. The spacers may include a multi-layer structure, such as a multi-layer structure including a silicon nitride layer and a silicon oxide layer. The spacers are formed by a suitable process to a suitable thickness. For example, spacers may be formed by depositing silicon nitride and silicon oxide layers and then dry etching the layers to form the spacers.

The fin structure 214 includes a base region 220, a collector region 222, and an emitter region 224. The base region 220 is disposed underneath the gate structure 218. As noted above, in the depicted embodiment, the gate structure 218 includes a gate dielectric layer over the fin structure 214 and a gate electrode over the gate dielectric layer. The gate structure 218 and base region 220 are thus capacitively coupled. The base region 220 is also disposed between the collector and emitter regions 222 and 224 of the fin structure 214. The base region 220 includes a lightly doped region, and the collector and emitter regions 222 and 224 include heavily doped regions. One skilled in the art will recognize that the terms lightly doped and heavily doped are terms of art that describe a doping concentration of the region that depends on the specific device type, technology generation, minimum feature size, and/or other factors. Accordingly, lightly doped and heavily doped should be interpreted in light of the technology being evaluated and not limited to the described embodiments herein.

In the depicted embodiment, the lightly doped region of the base region 220 is doped with a p-type dopant, such as boron, and the heavily doped regions of the collector and emitter regions 222 and 224 are doped with an n-type dopant, such as phosphorous. The lightly and heavily doped regions are formed by implantation, diffusion, annealing, and/or other suitable processes. The collector and emitter regions 222 and 224 may include raised/strained features. The raised/strained features include a epitaxially grown layer (epi layer). The raised/strained features may be formed before or after forming the heavily doped regions of the collector and emitter regions 222 and 224. The raised/strained features are formed by a suitable process, such as an epitaxy or epitaxial (epi) process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 214 (e.g., silicon). In an example, the raised/strained features comprise silicon germanium (SiGe), formed by a silicon germanium epitaxial deposition process. Alternatively, the raised/strained features could comprise silicon (Si). The raised/strained features may be doped during its deposition (growth) by adding impurities to the source material of the epitaxy process or subsequent to its deposition growth process by an ion implantation process. For example, a silicon epi layer may be doped with phosphorous (to form a Si:P epi layer). The doped epitaxial layer may have a gradient doping profile. Subsequently, a CMP process may be performed to planarize the raised/strained features.

In the depicted embodiment, since the collector and emitter regions 222 and 224 are heavily n-doped (N+), and the base region is lightly p-doped (such as a p-well region), the collector (222), base (220), and emitter (224) regions form a bipolar junction transistor (BJT). Referring to FIG. 1B, a terminal C is coupled with the collector region 222, a terminal B is coupled with the base region 220, a terminal E is coupled with the emitter region 224, and a terminal G is coupled with the gate structure 218. The terminals C, B, E, and/or G may be coupled indirectly or directly with the respective regions of the integrated circuit device 200. The terminals C, B, E, and/or G are formed by conductive terminal contacts (not shown). The conductive terminal contacts may comprise various conductive materials, such as copper, tungsten, and/or silicide. The integrated circuit device 200 may include other terminals, such as a terminal coupled with the substrate 210. The terminal coupled with the substrate 210 can be used to electrically bias the substrate 210.

In operation, the terminals C, B, E, and/or G are biased at various voltages to cause the integrated circuit device 200 to operate as a desired transistor device. For example, in the depicted embodiment, the terminals, C, B, E, G are biased so that the integrated circuit device 200 operates as a lateral BJT, specifically an NPN lateral BJT. The G terminal used to bias the gate structure 218 so that the gate structure 18 controls a conduction path between the collector region 222 and emitter region 224 of the BJT. For example, to bias the integrated circuit device 200 to operate as the BJT, a voltage of about 1.2 V may be applied to the B terminal, a voltage of about −0.25 V may be applied to the G terminal, a voltage of about 0 V to about 1.2 V may be applied to the C terminal, and a voltage of about 0 V to about 1.2 V may be applied to the E terminal. In the depicted embodiment, the integrated circuit device 200 may alternatively include a PNP lateral BJT, in which case, the doping configurations described herein should be read consistent with a PNP lateral BJT (for example, read with doping configurations having an opposite conductivity). Similarly, the biasing conditions should be modified accordingly so that the integrated circuit device 200 operates as a PNP lateral BJT.

The integrated circuit device 200 may be biased so that it exhibits varying characteristics for various applications, such as logic applications (for example, used as a metal-oxide-semiconductor (MOS) switch), radio frequency (RF) applications (for example, used as a BJT amplifier), memory applications (for example, used as zero capacitor random access memory (Z-RAM) storage in an embedded dynamic RAM (e-DRAM)), passive applications (for example, used as a high-Q metal-insulator-metal (MIM) capacitor, metal-oxide-metal (MOM) capacitor, and inductor using back end of line (BEOL) processing) and/or other suitable applications. For example, more specifically, the collector and emitter regions 222 and 224 can alternatively be referred to as source and drain regions, respectively, of the integrated circuit device 200. And, the base region 220 can alternatively be referred to as a channel region of the integrated circuit device 200. Thus, the terminals, C, B, E, G may be biased so that the integrated circuit device 200 operates as a fin-like field effect transistor (FinFET).

The integrated circuit device 200 may include additional features, which may be formed by subsequent processing. For example, various contacts/vias/lines and multilayer interconnect features (e.g., metal layers and interlayer dielectrics) may be formed over the substrate 210, configured to connect the various features or structures of the integrated circuit device 200. The additional features may provide electrical interconnection to the device 200. For example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

A current gain of the BJT is largely affected by a width of the base region 220. When the width of the base region 220 decreases, the current gain and frequency characteristics (such as cut-off frequency ($f_T$) and maximum oscillation frequency ($f_{max}$)) of the integrated circuit device 200 increase. In the depicted embodiment, the width of the base region 220 is confined by a length of the gate structure 218 ($L_G$). For example, the width of the base region 220 is about 100 µm to about 10 nm. The base region 220 is further confined by the collector and emitter regions 222 and 224. This ensures that the width (or thickness) of the base region 220 is substantially less than a diffusion length of minority carriers of the base region 220, which enhances base-emitter injection efficiency, improving the current gain of the integrated circuit device. Further, in the depicted embodiment, having the collector (source) region 222 and the emitter (drain) region 224 located above the insulator layer 212 prevents vertical parasitic junctions from existing, therefore reducing vertical parasitic effects, and preventing inherent vertical BJTs. This can particularly enhance the frequency characteristics of the integrated circuit device 200. For example, the SOI substrate in the depicted embodiment can reduce inherent vertical BJT junctions (and in some cases, unwanted lateral BJT junctions) from occurring. The SOI substrate also prevents substrate effects. Further, the integrated circuit device 200 is fabricated using planar or non-planar FinFET complementary MOS (CMOS) processing, and thus, is cost-effectively integrated into existing CMOS technology processing. Further, because the terminals can be biased to exhibit varying device characteristics, the integrated circuit device is particularly suitable for system-on-a-chip (SOC) technology. For example, an SOC can include multiple integrated circuit devices similar to integrated circuit device 200, and each integrated circuit device can be biased differently to achieve multiple integrated circuit device applications, such as those described above. Different embodiments may have different advantages, and no particular advantage is necessarily required of any embodiment.

Figure 2A:
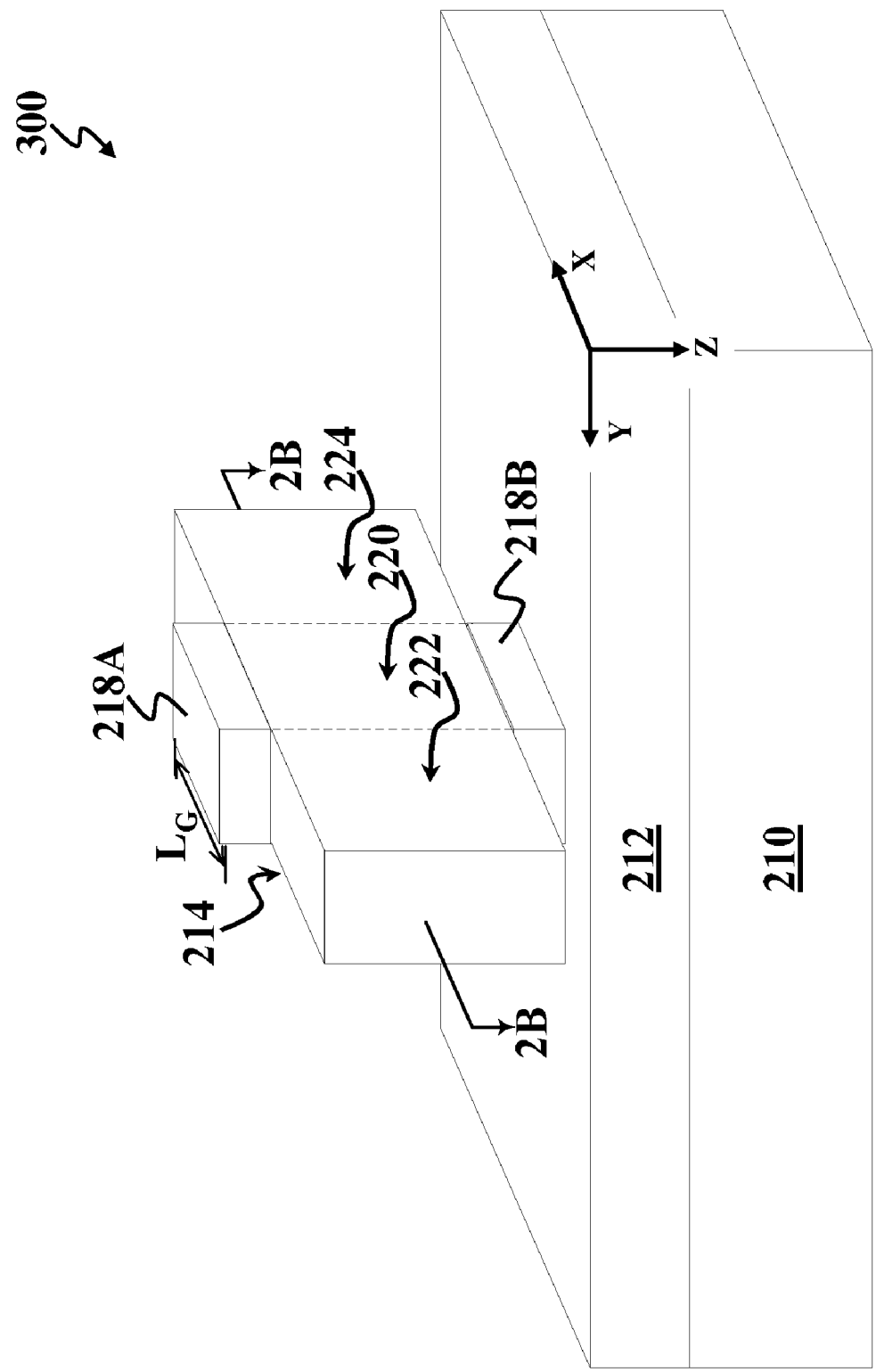
FIG. 2A is a perspective view of another embodiment of an integrated circuit device according to various aspects of the present disclosure.
Figure 2B:
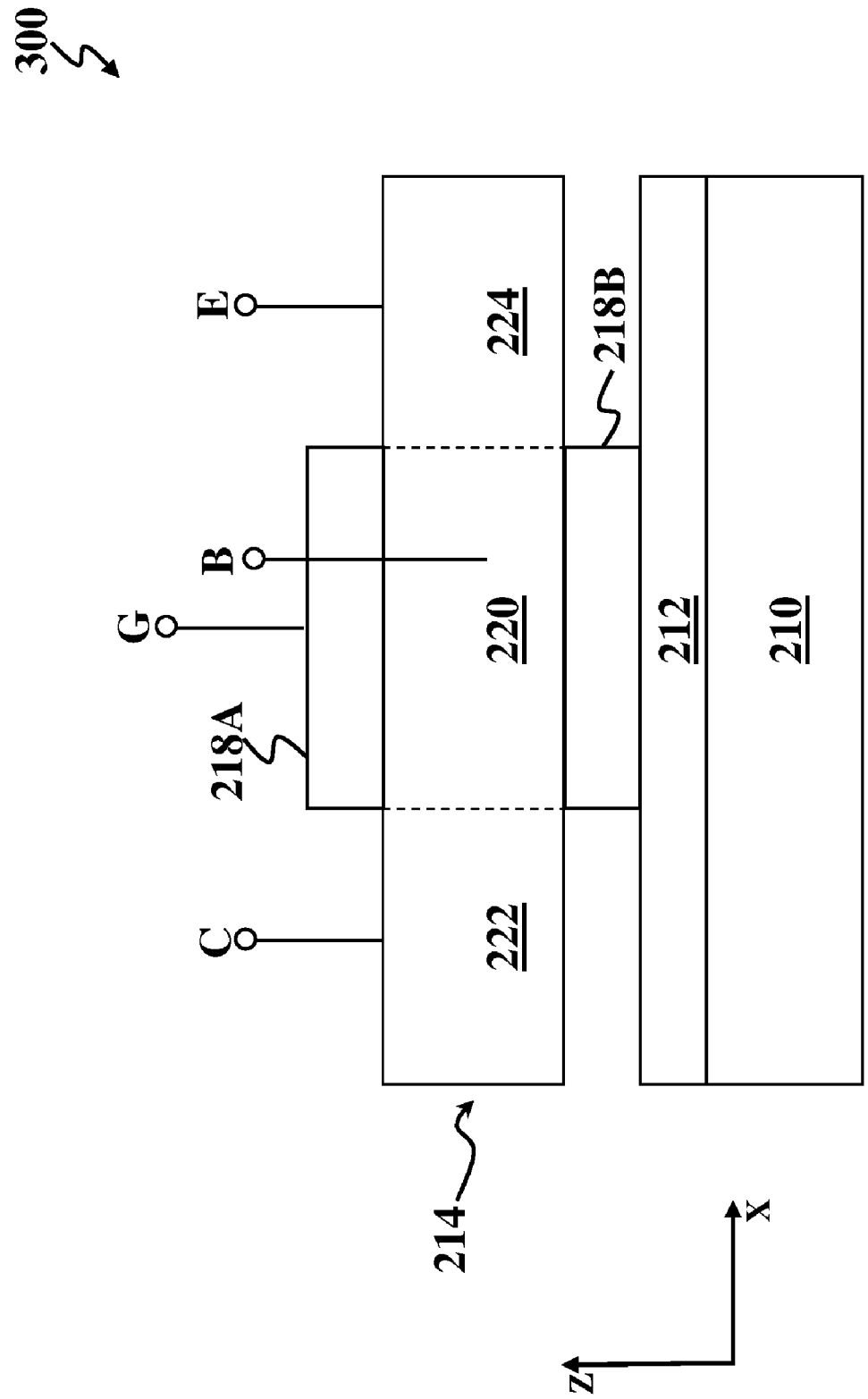
FIG. 2B is a diagrammatic cross-sectional view along a channel of the integrated circuit device taken along line 2B-2B in FIG. 2A.

FIG. 2A is a perspective view of an integrated circuit device 300, in portion or entirety, that is an alternative embodiment of the integrated circuit device 200 of FIGS. 1A and 1B. FIG. 2B is a diagrammatic cross-sectional view along a channel of the integrated circuit device 300 taken along line 2B-2B in FIG. 2A. FIGS. 2A and 2B will be discussed concurrently and have been simplified for the sake of clarity to better understand the inventive concepts of the present disclosure. The embodiment of FIGS. 2A and 2B is similar in many respects to the embodiment of FIGS. 1A and 1B. Accordingly, similar features in FIGS. 1A-1B and 2A-2B are identified by the same reference numerals for clarity and simplicity. In the depicted embodiment, the integrated circuit device 300 is a FinFET device configured to operate as a BJT device. The integrated circuit device 300 includes the gate structure 218. The gate structure 218 includes a portion 218A and a portion 218B. The portion 218A is disposed over a top surface of the base region 220, and the portion 218B is disposed over a bottom surface of the base region 220. In the depicted embodiment, the various terminals of the integrated circuit device 300 are biased such that the integrated circuit device 300 operates as a desired transistor device, such as a BJT. Additional features can be added in the integrated circuit device 300, and some of the features described below can be replaced or eliminated for other embodiments of the integrated circuit device 300.

Figure 3A:
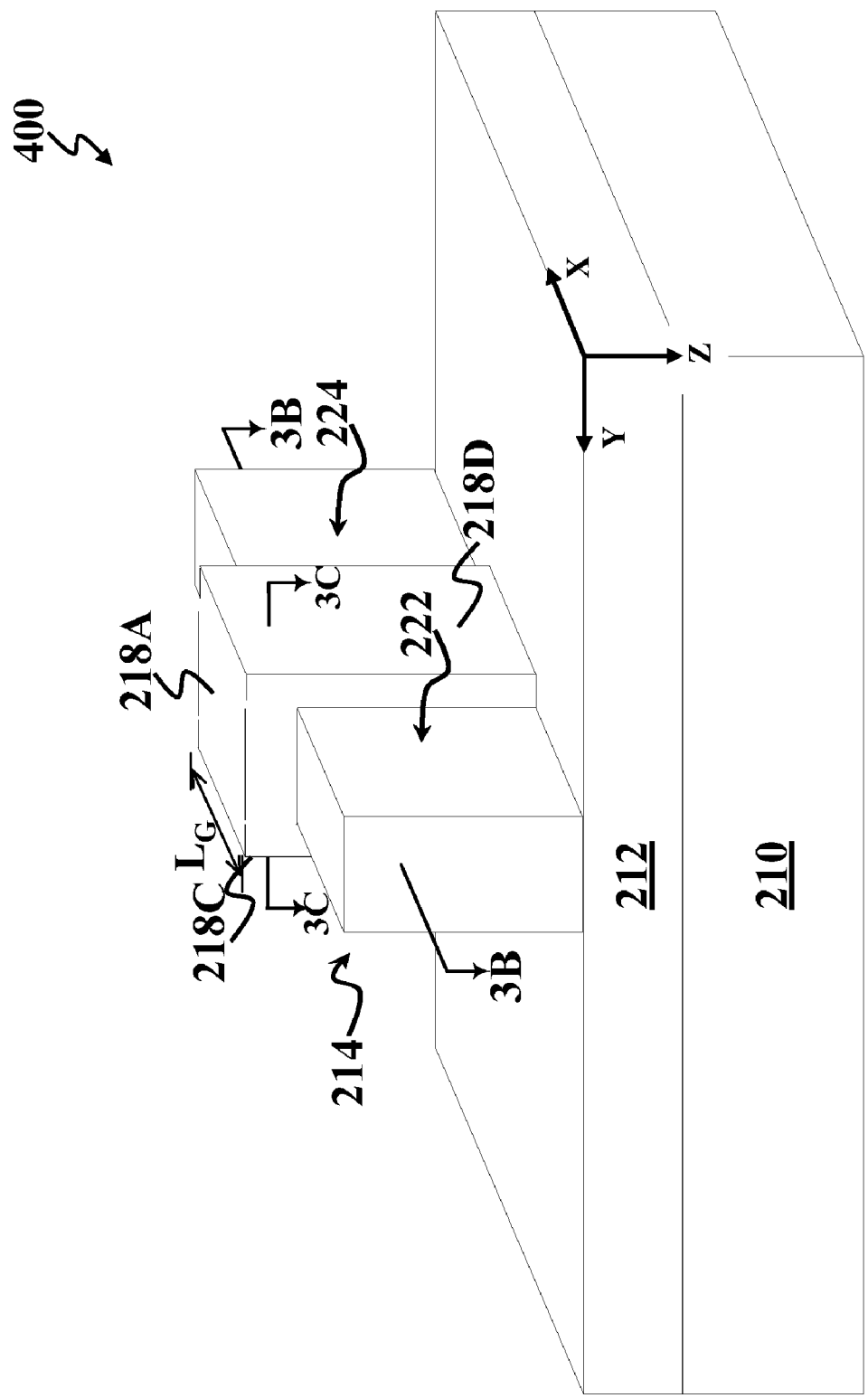
FIG. 3A is a perspective view of another embodiment of an integrated circuit device according to various aspects of the present disclosure.
Figure 3B:
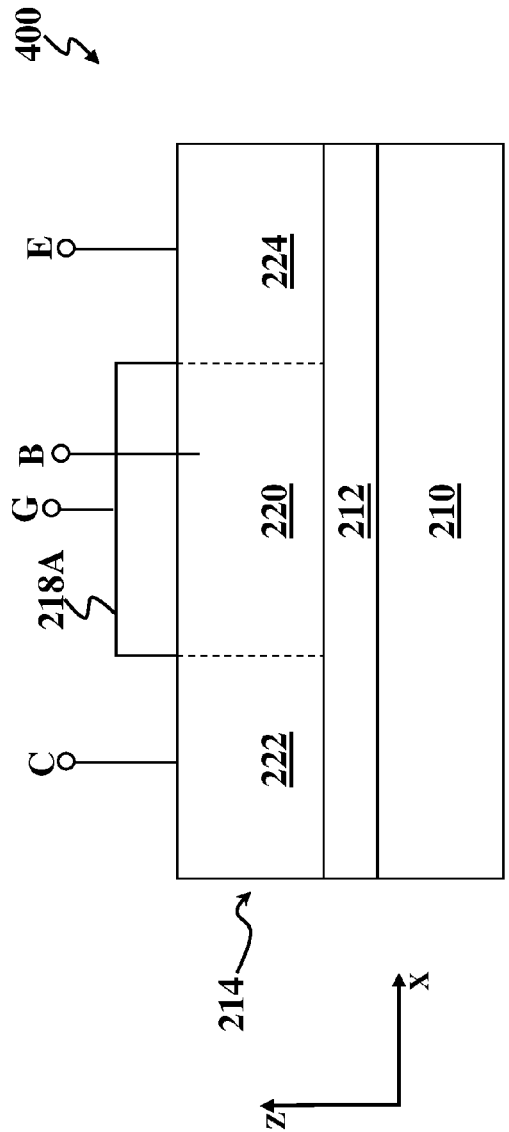
FIG. 3B is a diagrammatic cross-sectional view along a channel of the integrated circuit device taken along line 3B-3B in FIG. 3A.
Figure 3C:
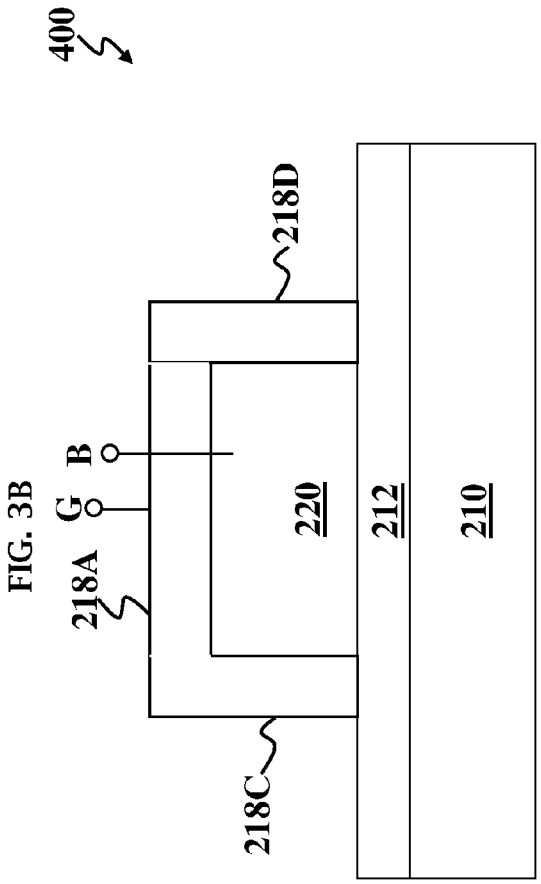
FIG. 3C is a diagrammatic cross-sectional view of the integrated circuit device taken along line 3C-3C in FIG. 3A

FIG. 3A is a perspective view of an integrated circuit device 400, in portion or entirety, that is an alternative embodiment of the integrated circuit device 200 of FIGS. 1A and 1B. FIG. 3B is a diagrammatic cross-sectional view along a channel of the integrated circuit device 400 taken along line 3B-3B in FIG. 3A, and FIG. 3C is a diagrammatic cross-sectional view of the integrated circuit device 400 taken along line 3C-3C in FIG. 3A. FIGS. 3A, 3B, and 3C will be discussed concurrently and have been simplified for the sake of clarity to better understand the inventive concepts of the present disclosure. The embodiment of FIGS. 3A-3C is similar in many respects to the embodiments of FIGS. 1A-2B. Accordingly, similar features in FIGS. 1A-2B and 3A-3C are identified by the same reference numerals for clarity and simplicity. In the depicted embodiment, the integrated circuit device 400 is a FinFET device configured to operate as a BJT device. The integrated circuit device 400 includes the gate structure 218. The gate structure 218 includes the portion 218A and portions 218C and 218D. The portion 218A is disposed over the top surface of the base region 220, and the portions 218C and 218D are disposed over sidewall surfaces of the base region 220. The base region 220 is confined by the portions 218A, 218C, and 218D of the gate structure 218. In the depicted embodiment, the various terminals of the integrated circuit device 400 are biased such that the integrated circuit device 400 operates as a desired transistor device, such as a BJT. Additional features can be added in the integrated circuit device 400, and some of the features described below can be replaced or eliminated for other embodiments of the integrated circuit device 400.

Figure 4A:
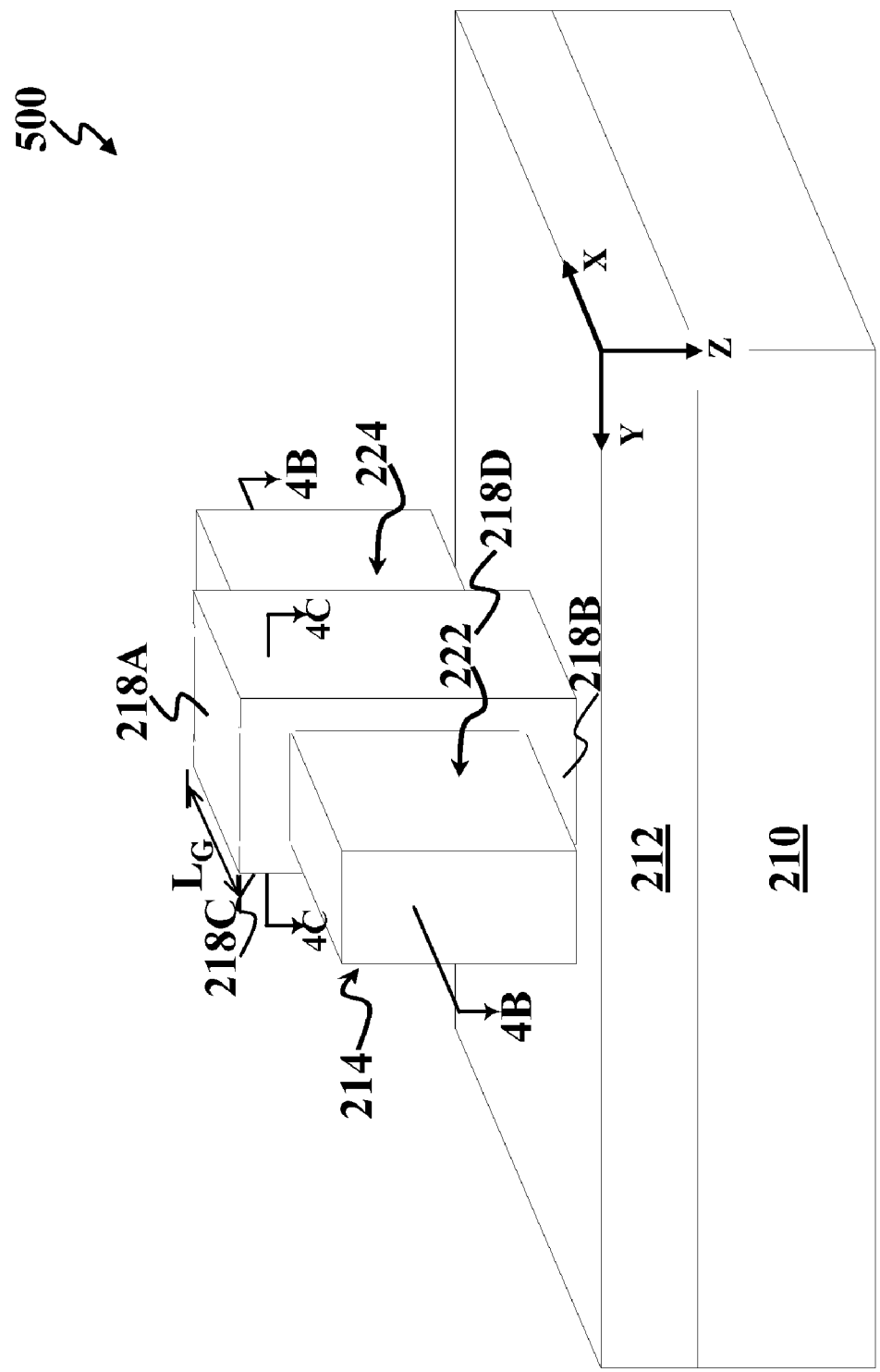
FIG. 4A is a perspective view of another embodiment of an integrated circuit device according to various aspects of the present disclosure.

FIG. 4A is a perspective view of an integrated circuit device 500, in portion or entirety, that is an alternative embodiment of the integrated circuit device 200 of FIGS. 1A and 1B. FIG. 4B is a diagrammatic cross-sectional view along a channel of the integrated circuit device 500 taken along line 4B-4B in FIG. 4A, and FIG. 4C is a diagrammatic cross-sectional view of the integrated circuit device 500 taken along line 3C-3C in FIG. 3A. FIGS. 4A, 4B, and 4C will be discussed concurrently and have been simplified for the sake of clarity to better understand the inventive concepts of the present disclosure. The embodiment of FIGS. 4A-4C is similar in many respects to the embodiments of FIGS. 1A-3B. Accordingly, similar features in FIGS. 1A-3B and 4A-4C are identified by the same reference numerals for clarity and simplicity. In the depicted embodiment, the integrated circuit device 500 is a FinFET device configured to operate as a BJT device. The integrated circuit device 500 includes the gate structure 218. The gate structure 218 includes the portions 218A, 218B, 218C, and 218D. The portion 218A is disposed over the top surface of the base region 220, the portion 218B is disposed over the bottom surface of the base region 220, and the portions 218C and 218D are disposed over sidewall surfaces of the base region 220. Accordingly, the gate structure 218 wraps around the base region 220, confining the base region 220 by the portions 218A, 218B, 218C, and 218D. In the depicted embodiment, the various terminals of the integrated circuit device 500 are biased such that the integrated circuit device 500 operates as a desired transistor device, such as a BJT. Additional features can be added in the integrated circuit device 500, and some of the features described below can be replaced or eliminated for other embodiments of the integrated circuit device 500.

Figure 5A:
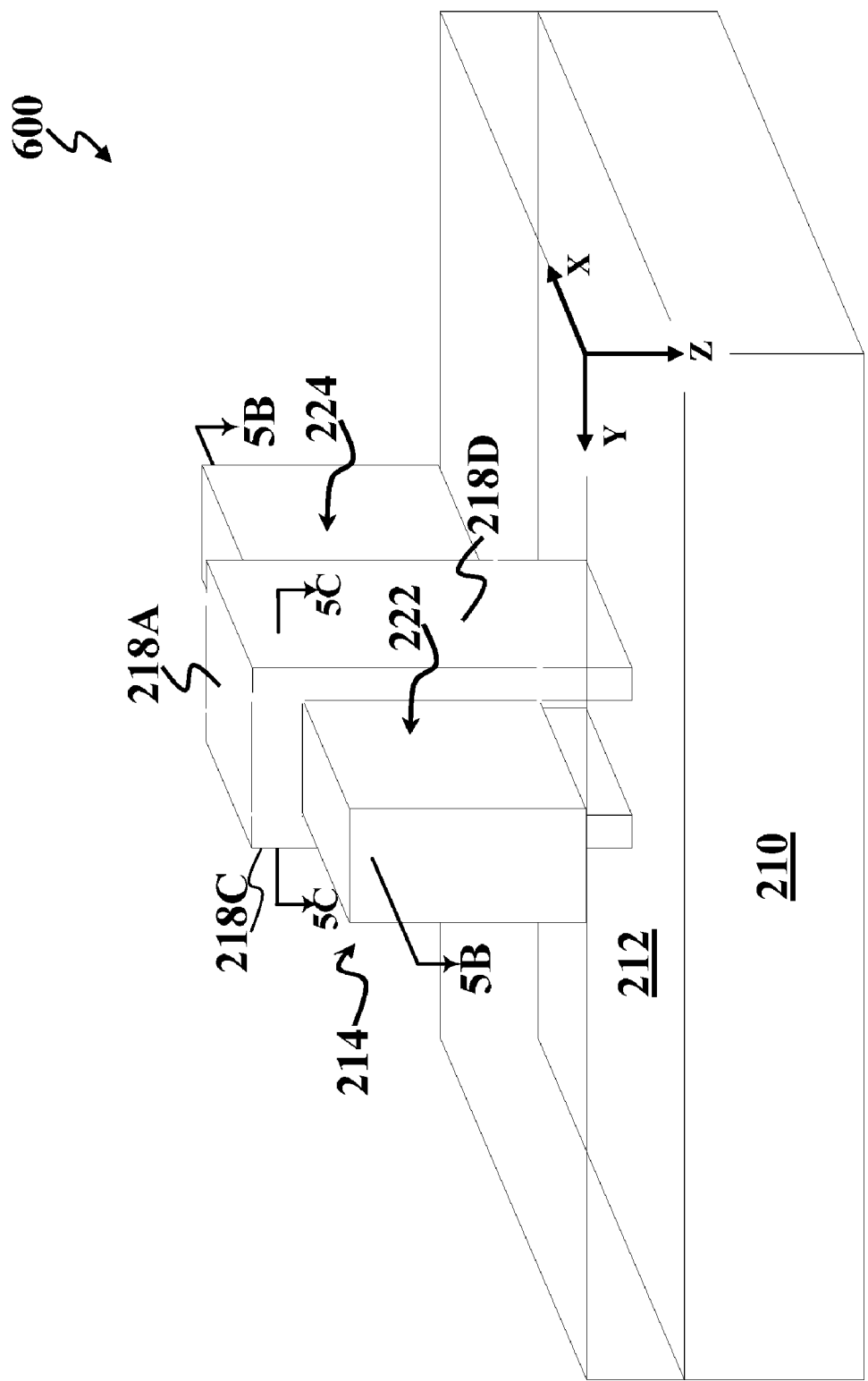
FIG. 5A is a perspective view of another embodiment of an integrated circuit device according to various aspects of the present disclosure.

FIG. 5A is a perspective view of an integrated circuit device 600, in portion or entirety, that is an alternative embodiment of the integrated circuit device 200 of FIGS. 1A and 1B. FIG. 5B is a diagrammatic cross-sectional view along a channel of the integrated circuit device 600 taken along line 5B-5B in FIG. 5A, and FIG. 5C is a diagrammatic cross-sectional view of the integrated circuit device 600 taken along line 5C-5C in FIG. 5A. FIGS. 5A, 5B, and 5C will be discussed concurrently and have been simplified for the sake of clarity to better understand the inventive concepts of the present disclosure. The embodiment of FIGS. 5A-5C is similar in many respects to the embodiments of FIGS. 1A-4B. Accordingly, similar features in FIGS. 1A-4B and 5A-5C are identified by the same reference numerals for clarity and simplicity. In the depicted embodiment, the integrated circuit device 600 is a FinFET device configured to operate as a BJT device. The integrated circuit device 600 includes the gate structure 218. The gate structure 218 includes the portions 218A, 218C, and 218D. The portion 218A is disposed over the top surface of the base region 220, and the portions 218C and 218D are disposed over sidewall surfaces of the base region 220. In the depicted embodiment, the portions 218C and 218D extend into the insulator layer 212. Accordingly, the gate structure 218 forms a pi (Π) gate structure that confines the base region 220 by the portions 218A, 218C, and 218D. In the depicted embodiment, the various terminals of the integrated circuit device 600 are biased such that the integrated circuit device 600 operates as a desired transistor device, such as a BJT. Additional features can be added in the integrated circuit device 600, and some of the features described below can be replaced or eliminated for other embodiments of the integrated circuit device 600.

Figure 6:
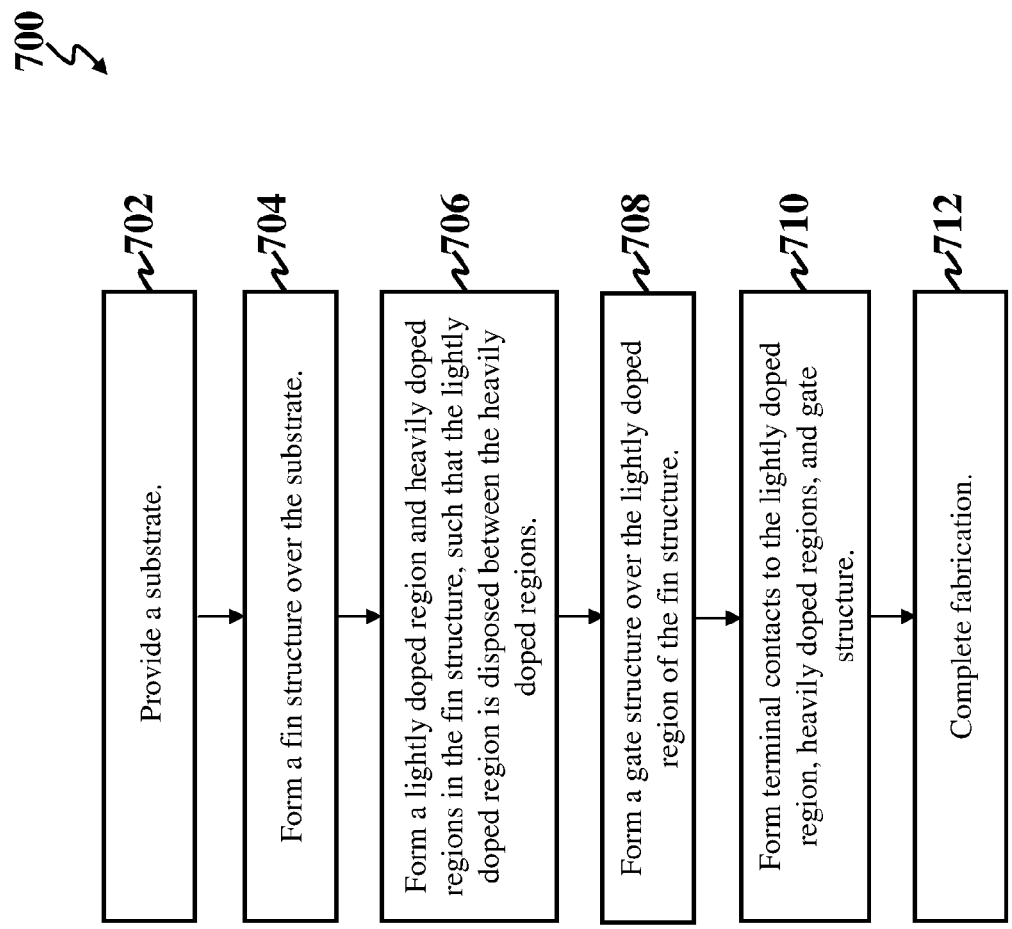
FIG. 6 is a flow chart of a method for fabricating an integrated circuit device according to various aspects of the present disclosure.

FIG. 6 is a flow chart of a method 700 for fabricating an integrated circuit device according to various aspects of the present disclosure. In the present embodiment, the method 700 is for fabricating FinFET device. The FinFET device can be configured to operate as a BJT, such as the integrated circuit devices 200, 300, 400, 500, and 600 described above. The method 700 begins at block 702 where a semiconductor substrate is provided. At block 704, a fin structure is formed over the substrate. At block 706, a lightly doped region and heavily doped regions are formed in the fin structure. The lightly doped region is disposed between the heavily doped regions. At block 708, a gate structure is formed over the lightly doped region of the fin structure. At block 710, terminal contacts are formed. Terminal contacts are coupled with the lightly doped region, heavily doped regions, and gate structure. The method 700 continues with block 712 where fabrication of the integrated circuit device is completed. Additional steps can be provided before, during, and after the method 700, and some of the steps described can be replaced or eliminated for other embodiments of the method.

The present disclosure provides for many different embodiments. In an example, an integrated circuit device includes: a semiconductor substrate; a fin structure disposed over the semiconductor substrate; and a gate structure disposed over the base portion of the fin structure. The collector portion is a first doped region including a first type dopant, and is coupled with a first terminal for electrically biasing the collector portion. The emitter portion is a second doped region including the first type dopant, and is coupled with a second terminal for electrically biasing the emitter portion. The base portion is a third doped region including a second type dopant opposite the first type, and is coupled with a third terminal for electrically biasing the base portion. The gate structure is coupled with a fourth terminal for electrically biasing the gate structure, such that the gate structure controls a path of current through the base portion. The first and second doped regions are heavily doped regions, and the third doped region is a lightly doped region. The base portion may have a thickness substantially less than a diffusion length of minority carriers of the base portion. A fifth terminal may be coupled with the semiconductor substrate for electrically biasing the substrate. The gate structure may include a gate dielectric layer disposed over the base portion and a gate electrode layer disposed over the gate dielectric layer. In an example, an insulator layer, such as a buried oxide layer, may be disposed between the semiconductor substrate and the fin structure.

In another example, a bipolar junction transistor includes a semiconductor substrate; a fin structure disposed over the semiconductor substrate; an emitter region and a collector region of a first conductivity type disposed in the fin structure; a base region of a second conductivity type disposed in the fin structure between the emitter region and the collector region, the second conductivity type being opposite the first conductivity type; and a gate structure disposed over the base region in the fin structure. The base region is electrically connected to a terminal for electrically biasing the base region, and the gate structure is capacitively coupled with the base region. The base region may have a thickness substantially less than a diffusion length of minority carriers of the base region. The emitter and collector regions are heavily doped regions, and the base region is a lightly doped region.

The gate structure may have various configurations. For example, the base region in the fin structure may include a top surface and sidewall surfaces that traverse the top surface, and the gate structure may be disposed on the top surface of the base region. The gate structure may further include a portion disposed on the sidewall surfaces of the base portion. An insulator layer may be disposed between the fin structure and the semiconductor substrate, wherein the portion of the gate structure disposed on the sidewall surfaces of the base region extends into the insulator layer. Further, the base region may further include a bottom surface, the sidewall surfaces traversing the bottom surface, and the gate structure may further include a portion disposed on the bottom surface of the base region. In another example, the gate structure disposed over the base region is wrapped around the base region in the fin structure.

In yet another example, an integrated circuit device includes: a semiconductor substrate; an insulator layer disposed over the semiconductor substrate; a fin structure disposed over the insulator layer, the fin structure including a first doped region, a second doped region, and a third doped region disposed between the first and second doped regions; and a gate structure disposed on the third doped region of the fin structure, the gate structure traversing the fin structure and separating the first and second doped regions. The first and second doped regions are heavily doped with a first dopant type, and the third doped region is lightly doped with a second dopant type. The integrated circuit device further includes a first terminal coupled with the first doped region; a second terminal coupled with the second doped region; a third terminal coupled with the third doped region; and a fourth terminal coupled with the gate structure. At least one of the first, second, third, or fourth terminals is biased such that the integrated circuit device operates as a desired transistor device. For example, the first, second, third, and fourth terminals are biased such that the integrated circuit device operates as a bipolar junction transistor, the fourth terminal being biased such that the gate structure controls a path of current of the bipolar junction transistor. Alternatively, the first, second, third, and fourth terminals are biased such that the integrated circuit device operates as a fin-like field effect transistor (Fin-FET).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
    a semiconductor substrate;
    a fin structure disposed on top of the semiconductor substrate, the fin structure having a collector portion, an emitter portion, and a base portion disposed between the collector and emitter portions, wherein:
        the collector portion is a first doped region including a first type dopant, the collector portion being coupled with a first terminal for electrically biasing the collector portion,
        the emitter portion is a second doped region including the first type dopant, the emitter portion being coupled with a second terminal for electrically biasing the emitter portion, and
        the base portion is a third doped region including a second type dopant opposite the first type, the base portion being directly connected to a third terminal for electrically biasing the base portion; and
    a gate structure disposed on top of the base portion of the fin structure, the gate structure being coupled with a fourth terminal for electrically biasing the gate structure, such that the gate structure controls a path of current through the base portion, wherein the gate structure includes a portion disposed below a bottom surface of the fin structure.

2. The integrated circuit device of claim 1 wherein the base portion has a thickness substantially less than a diffusion length of minority carriers of the base portion.

3. The integrated circuit device of claim 1 including a fifth terminal coupled with the semiconductor substrate for electrically biasing the substrate.

4. The integrated circuit device of claim 1 wherein the first type dopant is an n-type dopant and the second type dopant is a p-type dopant.

5. The integrated circuit device of claim 1 wherein the gate structure includes a gate dielectric layer disposed over the base portion and a gate electrode layer disposed over the gate dielectric layer.

6. The integrated circuit device of claim 1 including an insulator layer disposed between the semiconductor substrate and the fin structure.

7. The integrated circuit device of claim 6 wherein the insulator layer is a buried oxide layer.

8. A bipolar junction transistor comprising:
    a semiconductor substrate;
    a fin structure disposed over the semiconductor substrate;
    an emitter region and a collector region of a first conductivity type disposed in the fin structure;

a base region of a second conductivity type disposed in the fin structure between the emitter region and the collector region, the second conductivity type being opposite the first conductivity type, wherein the base region is electrically connected to a terminal for electrically biasing the base region; and a gate structure disposed over the base region in the fin structure, the gate structure being capacitively coupled with the base region, wherein the gate structure disposed over the base region is wrapped around the base region in the fin structure.

9. The bipolar junction transistor of claim 8 wherein the base region has a thickness substantially less than a diffusion length of minority carriers of the base region.

10. The bipolar junction transistor of claim 8 wherein the emitter and collector regions are heavily doped regions and the base region is a lightly doped region.

11. The bipolar junction transistor of claim 8:
wherein the base region in the fin structure includes a top surface and sidewall surfaces that traverse the top surface; and
wherein the gate structure disposed over the base region includes the gate structure being disposed on the top surface of the base region.

12. The bipolar junction transistor of claim 11 wherein the gate structure disposed over the base region further includes a portion disposed on the sidewall surfaces of the base portion.

13. The bipolar junction transistor of claim 11 including an insulator layer disposed between the fin structure and the semiconductor substrate, wherein the portion of the gate structure disposed on the sidewall surfaces of the base region extends into the insulator layer.

14. The bipolar junction transistor of claim 11:
wherein the base region further includes a bottom surface, the sidewall surfaces traversing the bottom surface; and
wherein the gate structure further includes a portion disposed on the bottom surface of the base region.

15. The bipolar junction transistor of claim 8 including an insulator layer disposed between the semiconductor substrate and the fin structure.

16. The bipolar junction transistor of claim 8 wherein the first conductivity type is n-type and the second conductivity type is p-type.

17. An integrated circuit device comprising:
a semiconductor substrate;
an insulator disposed on to of the semiconductor substrate;
a fin structure disposed on to of the insulator layer, the fin structure including a first doped region, a second doped region, and a third doped region disposed between the first and second doped regions;
a gate structure disposed on top of the third doped region of the fin structure, the gate structure traversing the fin structure and separating the first and second doped regions, wherein the first and second doped regions are heavily doped with a first dopant type and the third doped region is lightly doped with a second dopant type, wherein the gate structure includes a portion disposed below a bottom surface of the fin structure;
a first terminal coupled with the first doped region;
a second terminal coupled with the second doped region;
a third terminal directly connected to the third doped region; and
a fourth terminal coupled with the gate structure, wherein at least one of the first, second, third, or fourth terminals is biased such that the integrated circuit device operates as a desired transistor device.

18. The integrated circuit device of claim 17 wherein the first, second, third, and fourth terminals are biased such that the integrated circuit device operates as a bipolar junction transistor, the fourth terminal being biased such that the gate structure controls a path of current of the bipolar junction transistor.

19. The integrated circuit device of claim 17 wherein the first, second, third, and fourth terminals are biased such that the integrated circuit device operates as a fin-like field effect transistor (FinFET).

20. The integrated circuit device of claim 1, wherein the gate structure disposed over the base portion is wrapped around the base region in the fin structure.

* * * * *